United States Patent
Lee et al.

(10) Patent No.: US 11,004,953 B2
(45) Date of Patent: May 11, 2021

(54) MASK-FREE METHODS OF FORMING STRUCTURES IN A SEMICONDUCTOR DEVICE

(71) Applicant: GLOBALFOUNDRIES U.S. INC., Santa Clara, CA (US)

(72) Inventors: Rinus Tek Po Lee, Ballston Lake, NY (US); Hui Zang, Guilderland, NY (US); Jiehui Shu, Clifton Park, NY (US); Hong Yu, Clifton Park, NY (US); Wei Hong, Clifton Park, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 0 days.

(21) Appl. No.: 16/454,016

(22) Filed: Jun. 26, 2019

(65) Prior Publication Data
US 2020/0411664 A1    Dec. 31, 2020

(51) Int. Cl.
*H01L 29/66* (2006.01)
*H01L 21/8234* (2006.01)

(52) U.S. Cl.
CPC .............. *H01L 29/66484* (2013.01); *H01L 21/823412* (2013.01); *H01L 29/66545* (2013.01); *H01L 29/66787* (2013.01)

(58) Field of Classification Search
CPC ....... H01L 29/66484; H01L 21/823412; H01L 29/66545; H01L 29/66787
USPC .......................................... 257/365; 438/284
See application file for complete search history.

(56) References Cited

U.S. PATENT DOCUMENTS

| | | | |
|---|---|---|---|
| 5,212,106 A | 5/1993 | Erb et al. | |
| 5,989,963 A | 11/1999 | Luning et al. | |
| 7,422,948 B2 | 9/2008 | Wiliford | |
| 8,354,309 B2 | 1/2013 | Greene et al. | |
| 9,502,416 B1 | 11/2016 | Kim | |
| 2005/0204319 A1 | 9/2005 | Hanafi et al. | |
| 2011/0104880 A1* | 5/2011 | Heinrich | H01L 29/66583 438/585 |

(Continued)

*Primary Examiner* — Didarul A Mazumder
(74) *Attorney, Agent, or Firm* — David Cain

(57) ABSTRACT

A method is provided for fabricating a semiconductor device structure with a short channel and long channel component having different gate dielectric layers without using lithography processes or masks. The method includes forming first and second openings having sidewalls and bottom surfaces in a dielectric layer, the first opening being narrower than the second opening. A first material layer is formed in the first and second openings. A protective layer is formed over the first material layer, wherein the protective layer covers the sidewalls and the bottom surface of the second opening. A block layer is formed to fill the second opening and cover the protective layer therein. The method further includes removing side portions of the protective layer to expose upper portions of the first material layer in the second opening. The block layer is removed from the second opening to expose the protective layer remaining in the second opening. A second material layer is formed over the first material layer on the exposed upper portions of the first material layer in the second opening. An intermix layer is formed in the second opening using the first and second material layers. The protective layer from the second opening is removed to expose the first material layer.

11 Claims, 13 Drawing Sheets

(56) References Cited

U.S. PATENT DOCUMENTS

| | | | |
|---|---|---|---|
| 2011/0241086 A1* | 10/2011 | Kurz | H01L 23/5256 257/288 |
| 2012/0211838 A1* | 8/2012 | Kronholz | H01L 21/823814 257/369 |
| 2012/0313178 A1* | 12/2012 | Liao | H01L 21/82385 257/368 |
| 2014/0008720 A1* | 1/2014 | Xie | H01L 27/092 257/331 |
| 2014/0070320 A1* | 3/2014 | Mukherjee | H01L 21/823456 257/368 |
| 2014/0319620 A1* | 10/2014 | Hoentschel | H01L 29/66606 257/379 |
| 2015/0145062 A1* | 5/2015 | Chudzik | H01L 29/4966 257/392 |
| 2016/0163601 A1* | 6/2016 | Xie | H01L 21/823468 257/392 |
| 2016/0240630 A1* | 8/2016 | Seong | H01L 29/401 |
| 2016/0293492 A1* | 10/2016 | Fan | H01L 27/0886 |
| 2016/0293493 A1* | 10/2016 | Fan | H01L 21/28114 |

* cited by examiner

MASK-FREE METHODS OF FORMING STRUCTURES IN A SEMICONDUCTOR DEVICE

FIELD OF THE INVENTION

The present disclosure generally relates to semiconductor device fabrication and integrated circuits. More particularly, the present disclosure relates to gate dielectric fabrication for transistor devices having a short channel and a long channel component. The present disclosure also relates to semiconductor devices with short channel and long channel devices having different threshold voltages.

BACKGROUND

The majority of present day integrated circuits (ICs) are implemented by using a plurality of interconnected field-effect transistors (FETs). FETs generally include an active semiconductor region, a source, a drain and a gate electrode. The gate electrode comprises a metal and a gate dielectric layer. When a control voltage exceeding a threshold voltage is applied to the gate electrode, an inversion or depletion layer is formed in a channel defined in the active semiconductor region between the source and the drain, and carrier flow occurs between the source and drain to produce a device output current.

The integration of multiple devices in a single chip enables different functionalities for various applications. For example, a short channel device is typically used for high frequency applications whereas a long channel device is used for applications requiring low leakage current components. It is desirable to control the threshold voltages and in turn the current flow for short channel and long channel devices independently. The threshold voltage may be adjusted by varying the physical thickness, dielectric constant or effective oxide thickness of a gate dielectric layer on top of a channel in a device. The term "effective oxide thickness" or EOT is used herein to denote the gate dielectric layer thickness as calculated in terms of a silicon dioxide or $SiO_2$ layer. EOT is equivalent to the physical thickness of a gate dielectric layer multiplied by the ratio of the dielectric constant of $SiO_2$ to the dielectric constant of the gate dielectric layer.

A typical approach to fabricate multiple devices with different threshold voltages in a single chip is to utilize photolithographic technologies and several masks. These masks enable the creation of various patterns over a substrate, which in turn enables the modification of desired features in a device (e.g., the thicknesses of a gate dielectric layer), thereby allowing adjustments to the threshold voltage of the device. However, there are costs associated with the use of masks and the associated photolithographic tools. Photolithographic processes are complicated requiring multiple layers, such as photoresists, anti-reflective coatings and planarizing layers, and multiple steps are required, such as deposition, photolithographic exposure and photoresist development, etching and photoresist removal and cleaning. Reducing the number of masks and the associated photolithographic process steps to manufacture structures in a semiconductor device is generally advantageous.

SUMMARY

In an aspect of the present disclosure, there is provided a semiconductor device comprising first and second structures formed above an active region, wherein the first and second structures are separated by a dielectric structure. The first and second structures having sidewalls and bottom surfaces, wherein the bottom surface of the first structure is narrower than the bottom surface of the second structure. A high dielectric constant (high-k) intermix layer is disposed over the sidewalls and over the bottom surface of the first structure and over an upper portion of the sidewalls of the second structure.

In another aspect of the present disclosure, there is provided a method of forming a semiconductor device structure comprising forming a first and second openings having sidewalls and bottom surfaces in a dielectric layer, wherein the first opening is narrower than the second opening, forming a first material layer in the first and second openings, forming a protective layer over the first material layer, wherein the protective layer covers the sidewalls and the bottom surface of the second opening, forming a block layer, wherein the block layer fills the second opening and covers the protective layer therein, removing side portions of the protective layer to expose upper portions of the first material layer in the second opening, removing the block layer from the second opening to expose the protective layer remaining in the second opening, forming a second material layer on the exposed upper portions of the first material layer in the second opening, forming an intermix layer in the second opening using the first and second material layers and removing the protective layer from the second opening to expose the first material layer.

In yet another aspect of the present disclosure, there is provided a method of forming a semiconductor device structure comprising forming a first and second gate openings having sidewalls and bottom surfaces in a dielectric layer, the first and second gate openings being formed above an active region, wherein the first gate opening has a shorter channel length than the second gate opening, forming a first gate dielectric layer in the first and second gate openings, forming a protective layer over the first gate dielectric layer, wherein the protective layer covers the sidewalls and the bottom surface of the second gate opening, forming a block layer, wherein the block layer fills the second gate opening and covers the protective layer therein, removing side portions of the protective layer to expose upper portions of the first gate dielectric layer in the second gate opening, removing the block layer from the second gate opening to expose the protective layer remaining in the second gate opening, forming a second gate dielectric layer over the first gate dielectric layer on the exposed upper portions of the first gate dielectric layer in the second gate opening, forming an intermix layer in the second gate opening using the first and second gate dielectric layers and removing the protective layer from the second gate opening to expose the first gate dielectric layer.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1A:
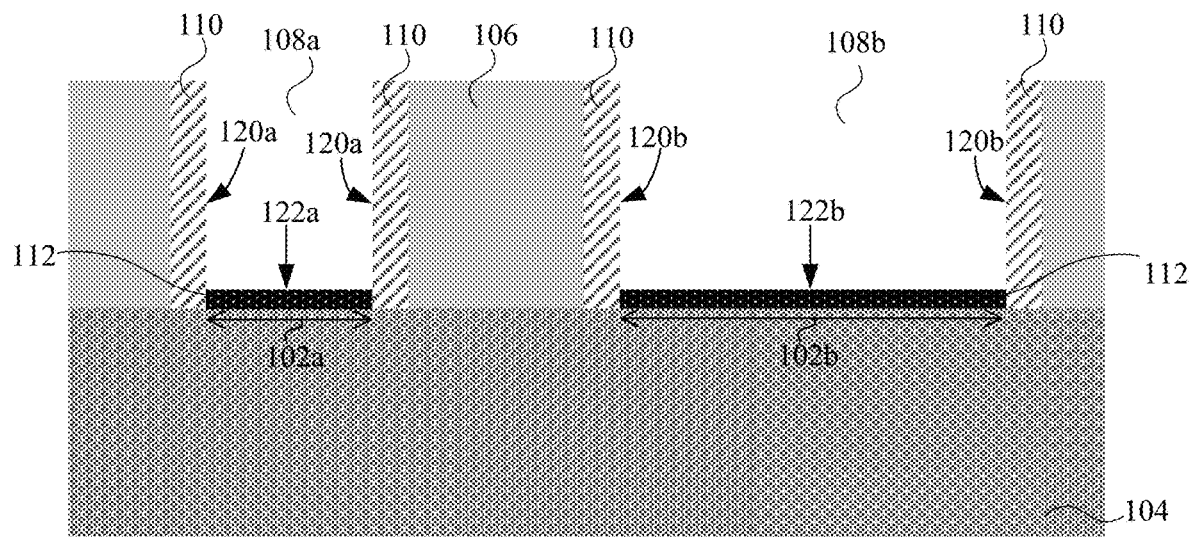
FIGS. 1A and 1B are cross-sectional and planar views, respectively, of a partially completed semiconductor device structure in accordance with embodiments of the present disclosure.
Figure 1B:
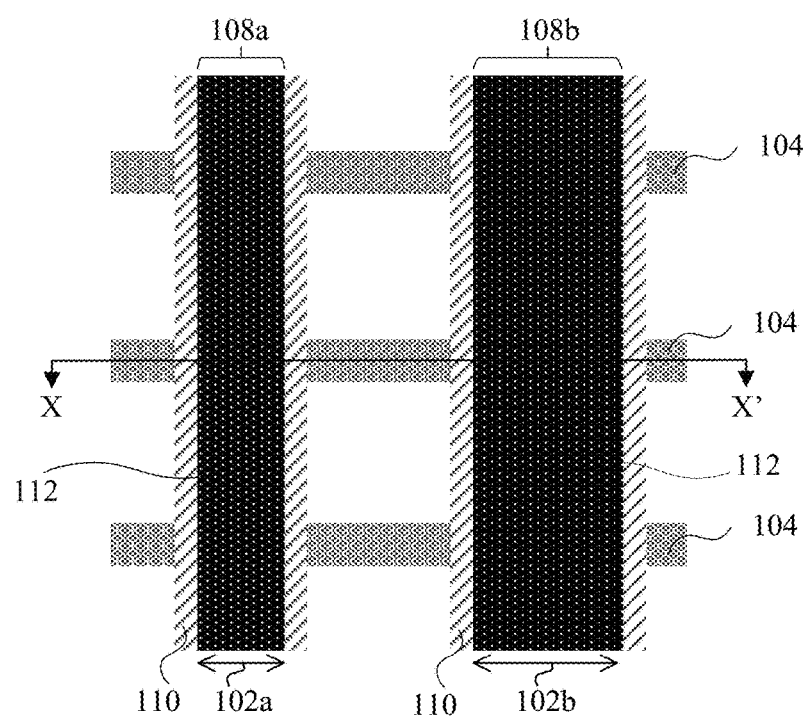

FIGS. 1A and 1B are cross-sectional and planar views, respectively, of a partially completed semiconductor device structure in accordance with embodiments of the present disclosure. The device structure may include an active region 104 (e.g., a fin), and first and second openings, 108a and 108b, respectively, disposed above the active region 104. The first and second openings, 108a and 108b, respectively, may be used for gate openings for short and long channel devices.

The first and second openings, 108a and 108b, respectively, are separated or electrically isolated from each other by a dielectric structure 106. The dielectric structure 106 may be an interlayer dielectric (ILD). Additionally, the first and second openings (108a and 108b, respectively) may be flanked by sidewall spacer structures 110, and an interfacial dielectric layer 112 is formed at the bottom of the openings. In a preferred embodiment, the interfacial dielectric layer 112 is an oxide layer such as silicon dioxide or $SiO_2$. The $SiO_2$ interfacial dielectric layer 112 provides a stable interface between the active region 104 and the dielectric layer 112. As shown in FIG. 1A, the first and second openings (108a and 108b, respectively) have sidewall surfaces 120a and 120b, and bottom surfaces 122a and 122b. In some embodiments, the bottom surface 122a of the first opening 108a may be smaller than the bottom surface 122b of the second opening 108b.

The dielectric structure 106 may be made of a low dielectric constant (low-k) material. A low-k material has a dielectric constant lower than 7. Some examples of low-k materials include silicon oxide, silicon oxynitride, borosilicate glass (BSG), phosphoric silicate glass (PSG), fluorinated silicate glass (FSG).

In accordance with the present disclosure, the channel lengths 102a and 102b refer to a short channel and a long channel device channel lengths, respectively. The terms "long channel" and "short channel" are relative terms, but as used herein, the term "short channel" refers to a channel length that is approximately equal to the current technology minimum channel length that is allowed by the design rules of a specific processing technology generation, whereas the term "long channel" refers to a channel length that is at least 200 percent greater than the current technology minimum channel length that is allowed by the design rules of a specific processing technology generation. For example, the first opening 108a has a channel length 102a in the range of about 15 nm to about 30 nm, while the second opening 108b has a channel length 102b in the range of about 30 nm to about 300 nm.

FIG. 1B shows a planar view for the semiconductor device structure shown in FIG. 1A. The line X-X' indicates the position of a section line for the cross-sectional view shown in FIG. 1A. For clarity's sake, the dielectric structure 106 is omitted so as not to obscure the illustration of active regions 104 positioned underneath.

While the active region 104 is represented as a fin in the accompanying drawings, it should be noted that the fin is used only as a non-limiting example of the active region 104, and other active regions (e.g., a doped layer on a top surface of a bulk semiconductor substrate or a semiconductor-on-insulator layer) may be used as well. The active region 104 may further include source/drain regions (not shown). A channel may form in the active region 104 underneath the openings 108a and 108b during device operation. It should also be understood that the present disclosure can be applied to any type of transistor device architecture, such as a three-dimensional device architecture (e.g., FinFETs), or a planar device architecture (e.g., complementary metal oxide semiconductor (CMOS) devices), semiconductor-on-insulator (SOI) devices). The active region 104 may be made of any suitable semiconductor material, such as silicon, germanium, or silicon germanium.

Figure 2:
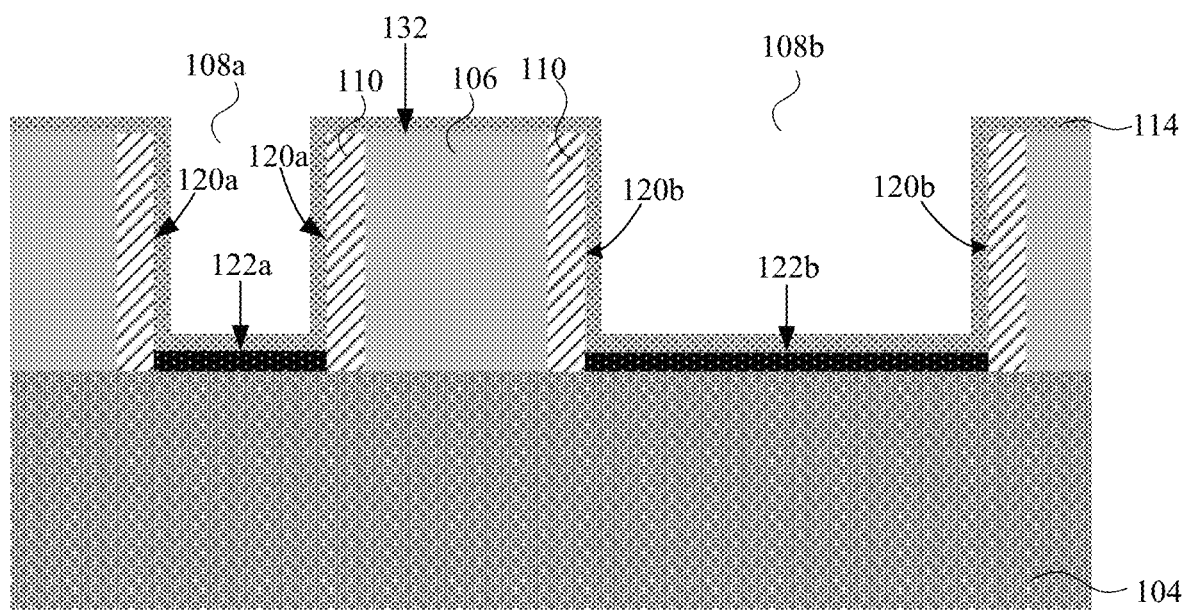
FIGS. 2 to 13 are cross-sectional views depicting successive stages of forming a semiconductor device structure in accordance with embodiments of the present disclosure.

Referring to FIG. 2, a first material layer 114 may be formed in the first and second openings, 108a and 108b, respectively. In accordance with an embodiment of this disclosure, the first material layer 114 may be a gate dielectric layer. The first material layer 114 may be formed by conventional deposition processes, such as chemical vapor deposition (CVD), physical vapor deposition (PVD), molecular beam deposition (MBD), pulsed laser deposition (PLD), liquid source misted chemical deposition (LSMCD), atomic layer deposition (ALD), etc. However, a highly conformal deposition process is preferred for depositing the first material layer 114; for example, an ALD process or a highly-controlled CVD process. As shown in FIG. 2, the first material layer 114 is deposited on and conforming to the sidewall surfaces 120a and 120b and the bottom surfaces 122a and 122b. In addition, the first material layer 114 is formed on a top surface 132 of the dielectric structure 106.

In one embodiment, the first material layer 114 may be made of a high dielectric constant (high-k) material. The term "high-k" as used herein refers to a material having a dielectric constant (i.e., k value) that is greater than 10. The high-k material may include, but is not limited to, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$), hafnium oxynitride ($HfO_xN_y$), zirconium oxynitride ($ZrO_xN_y$), lanthanum oxynitride ($La_2O_xN_y$), aluminum oxynitride ($Al_2O_xN_y$), titanium oxynitride ($TiO_xN_y$), strontium titanium oxynitride ($SrTiO_xN_y$), lanthanum aluminum oxynitride ($LaAlO_xN_y$), yttrium oxynitride ($Y_2O_xN_y$), a silicate thereof, and an alloy thereof. Each value of x is independently from 0.5 to 3 and each value of y is independently from 0 to 2. The first material layer 114 may have a thickness in the range of about 0.5 nm to about 6 nm, and preferably about 0.5 nm to about 3 nm.

The k value of a $SiO_2$ layer is about 3.9. A high-k dielectric material, having a k-value greater than 10, will have a lower EOT than a $SiO_2$ layer with similar physical thickness. Hence, this enables the use of a high-k dielectric material with a thicker physical thickness as compared to using $SiO_2$ alone, resulting in better reliability such as higher resistance to gate dielectric breakdown.

Figure 3:
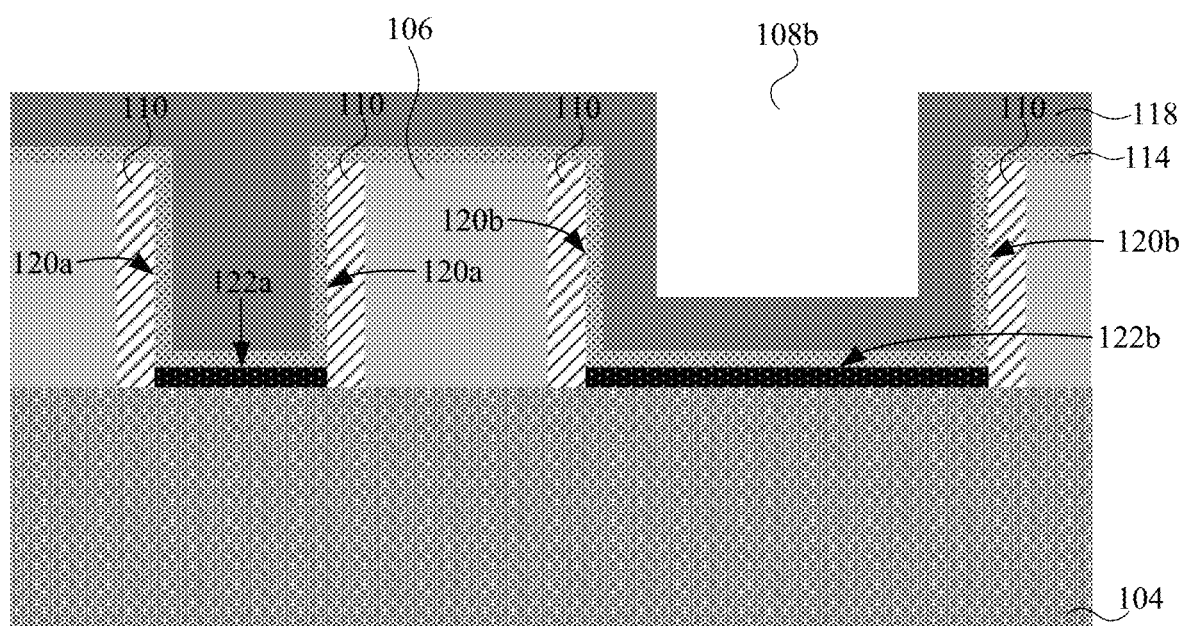

Referring to FIG. 3, a protective layer 118 may be formed over the first material layer 114. The protective layer 118 fills the first opening 108a and uniformly covers the sidewalls 120b and the bottom surface 122b of the second opening 108b. Hence, the protective layer 118 pinches off the first opening 108a due to its smaller size relative to the second opening 108b.

The protective layer 118 may be made of amorphous silicon (a-Si), titanium oxide ($TiO_2$), titanium nitride (TiN) or any other suitable material. The protective layer 118 may be formed by conventional deposition processes; however, a highly conformal process (e.g., PVD process, or highly-controlled CVD process) is preferred. As shown in FIG. 3, the protective layer 118 is conformally deposited on the first material layer 114.

Figure 4:
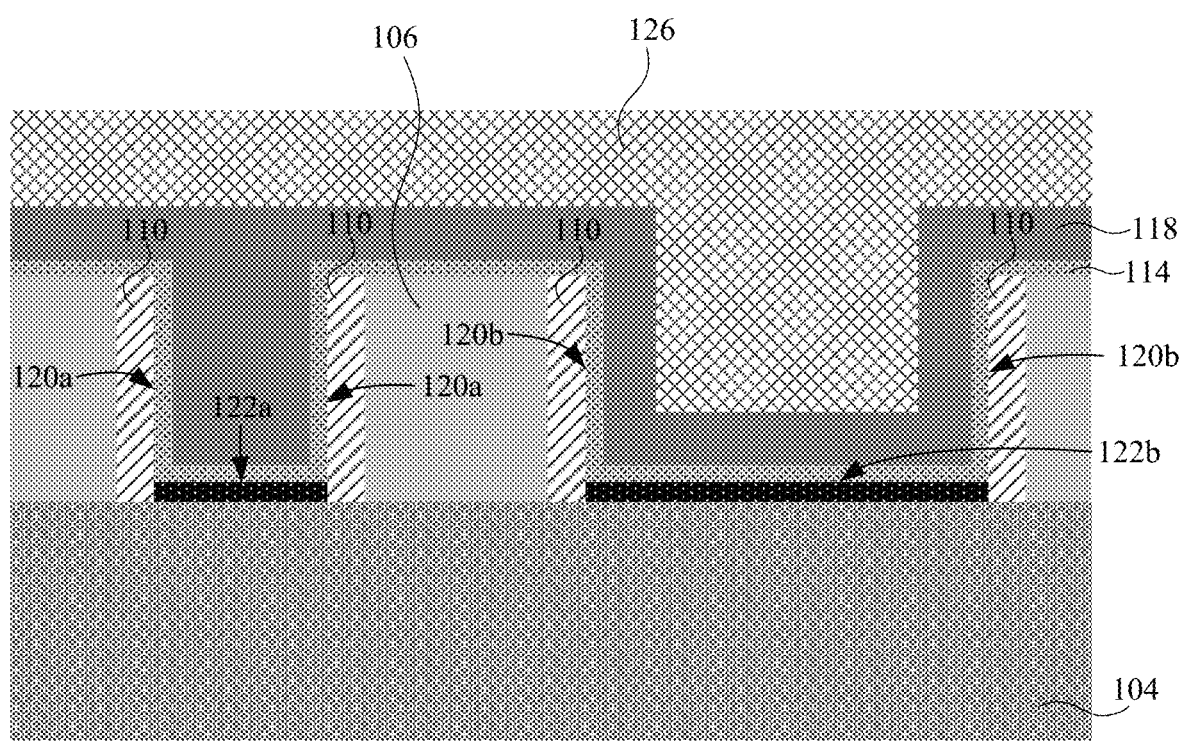

Referring to FIG. 4, a block layer 126 may be formed over the protective layer 118. The block layer 126 may be formed by a conventional deposition process, such as spin-on coating or CVD. In accordance with the present disclosure, the block layer 126 may be a spin on hard mask (SOH) made of spin on carbon material. The spin-on carbon material may include a polymeric compound containing atoms selected from the group consisting of carbon, hydrogen, oxygen, and nitrogen.

Figure 5:
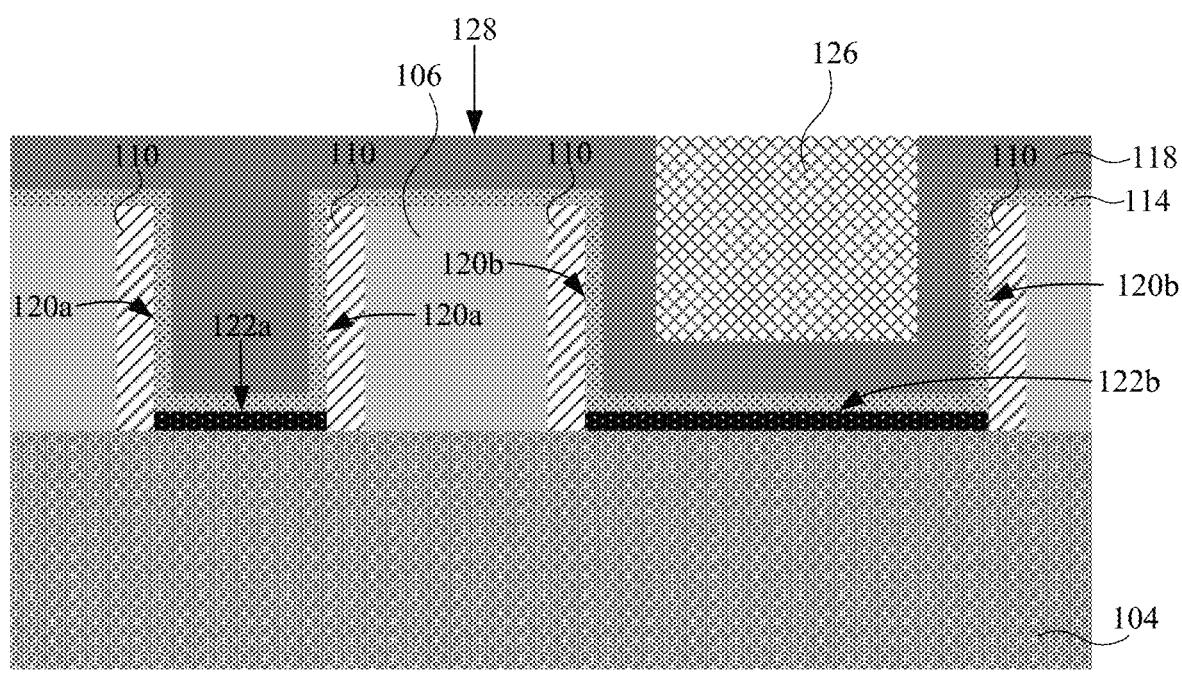

Referring to FIG. 5, the block layer 126 above a level of a top surface 128 of the protective layer 118 may be removed. A portion of the block layer 126 covering the protective layer 118 within the filled second opening 108b may be maintained. The removal process may be performed by selective etching or chemical mechanical planarization (CMP).

The term "selective etching" means a chemical etching method which can selectively remove a target layer without attacking the layer beneath the target layer, termed a stop layer for this reason, by adjusting the composition of the chemical solution and, as a result, adjusting the etching rates between the target layer and the stop layer.

Figure 6:
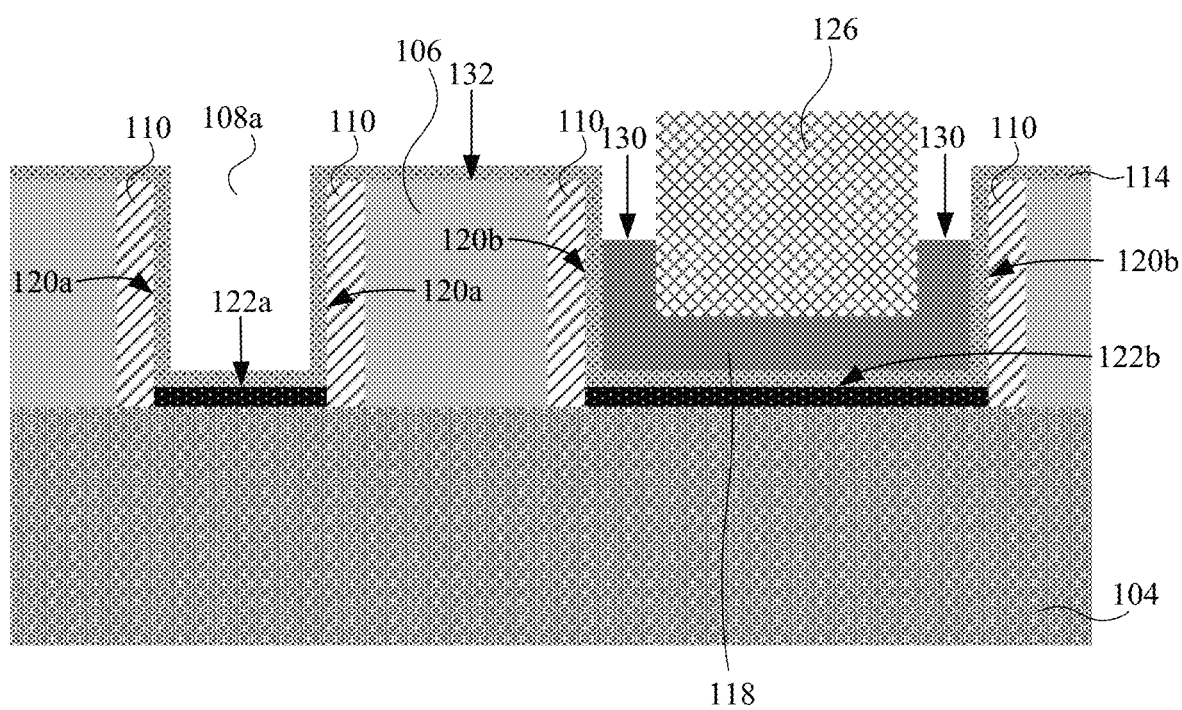

Referring to FIG. 6, the protective layer 118 may be removed by a selective etching process from the first opening 108a and from side portions between the block layer 126 and the first material layer 114 in the filled opening 108b. Hence, the block layer 126 covers and protects a portion of the protective layer 118 from being removed by the etching process.

The removal of the protective layer 118 exposes the first material layer 114 in the first opening 108a. The remaining portion of the protective layer 118 covers the bottom surface 122b and a portion of the sidewalls 120b of the second opening 108b. The side portions of the protective layer 118 remaining in the second opening 108b are removed to a level 130, which is below a top surface 132 of the dielectric layer 106, due to a smaller exposed surface area resulting in a slower rate of removal.

Figure 7:
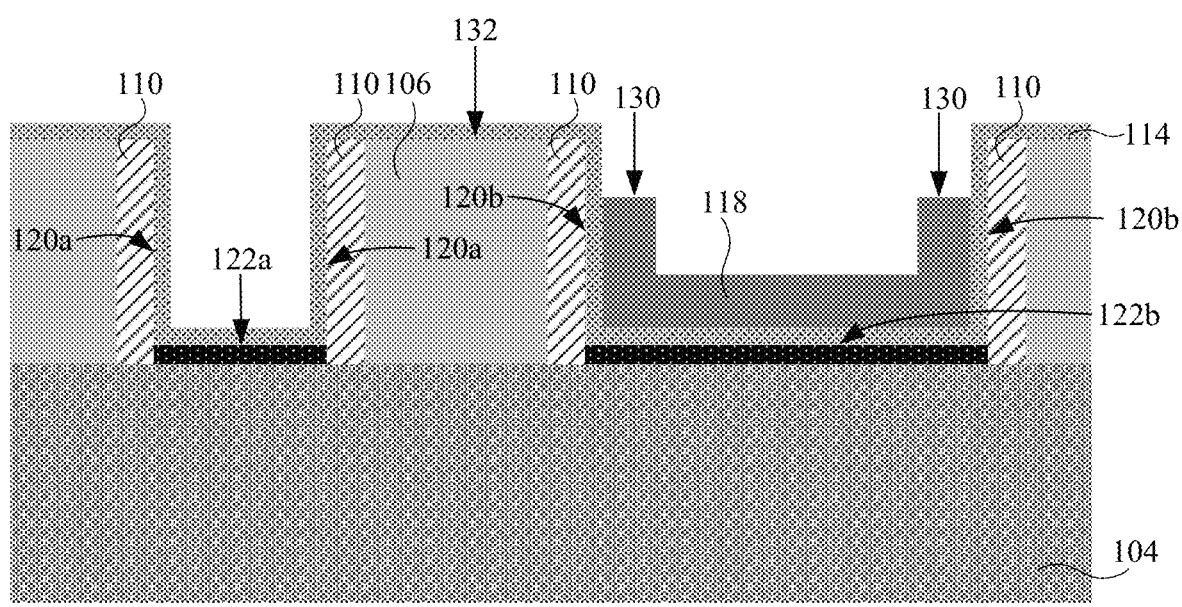

Referring to FIG. 7, the block layer 126 may be removed from the second opening 108b by selective etching, while maintaining the portion of the protective layer 118 covering the bottom surface 122b and a portion of the sidewalls 120b of the second opening 108b. The protective layer 118 is used to create sidewall portions in the opening 108b.

Figure 8:
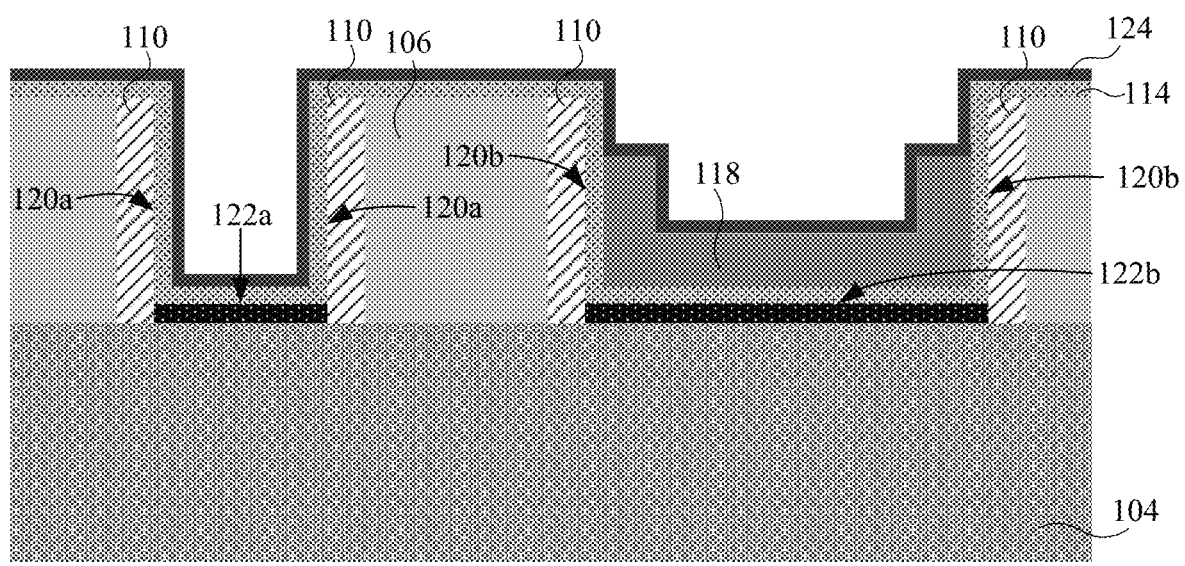

Referring to FIG. 8, a second material layer 124 may be formed over the first material layer 114 in the first opening 108a and on exposed portions of the sidewalls 120b of the second opening 108b. The first material layer 114 that is covered by the protective layer 118 does not come into contact with the second material layer 124.

In one embodiment, the second material layer 124 may be a second gate dielectric layer and may be made of a high-k dielectric material. The second material layer 124 may have a thickness in the range of about 0.5 nm to about 6 nm, and preferably about 0.5 nm to about 3 nm. The second material layer 124 may include, but is not limited to, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$), hafnium oxynitride ($HfO_xN_y$), zirconium oxynitride ($ZrO_xN_y$), lanthanum oxynitride ($La_2O_xN_y$), aluminum oxynitride ($Al_2O_xN_y$), titanium oxynitride ($TiO_xN_y$), strontium titanium oxynitride ($SrTiO_xN_y$), lanthanum aluminum oxynitride ($LaAlO_xN_y$), yttrium oxynitride ($Y_2O_xN_y$), a silicate thereof, and an alloy thereof. Each value of x is independently from 0.5 to 3 and each value of y is independently from 0 to 2. In a preferred embodiment, the first and second material layers, 114 and 124 respectively, are made of different high-k dielectric materials.

The second material layer 124 may be formed by conventional deposition processes, such as chemical vapor deposition (CVD), physical vapor deposition (PVD), molecular beam deposition (MBD), pulsed laser deposition (PLD), liquid source misted chemical deposition (LSMCD), atomic layer deposition (ALD), etc. However, a highly conformal deposition process is preferred for depositing the second material layer 124; for example, an ALD process or a highly-controlled CVD process.

Figure 9:
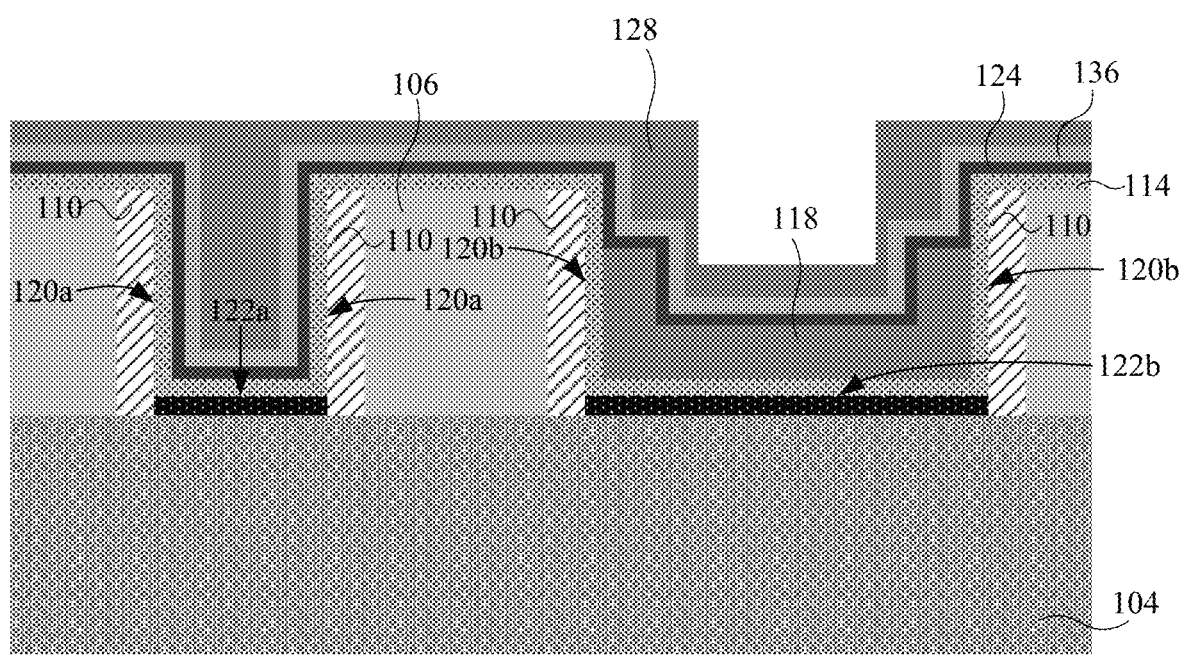

Referring to FIG. 9, a sacrificial liner 136 may be formed over the semiconductor device structure. In accordance with the present disclosure, the sacrificial liner 136 may be made of TiN. Thereafter, a second sacrificial liner 128 may be formed over sacrificial liner 136 and may be made of a-Si. The sacrificial liners 136 and 128 may be formed by conventional deposition processes; however, a highly conformal process (e.g., ALD process or highly-controlled CVD process) is preferred.

Figure 10:
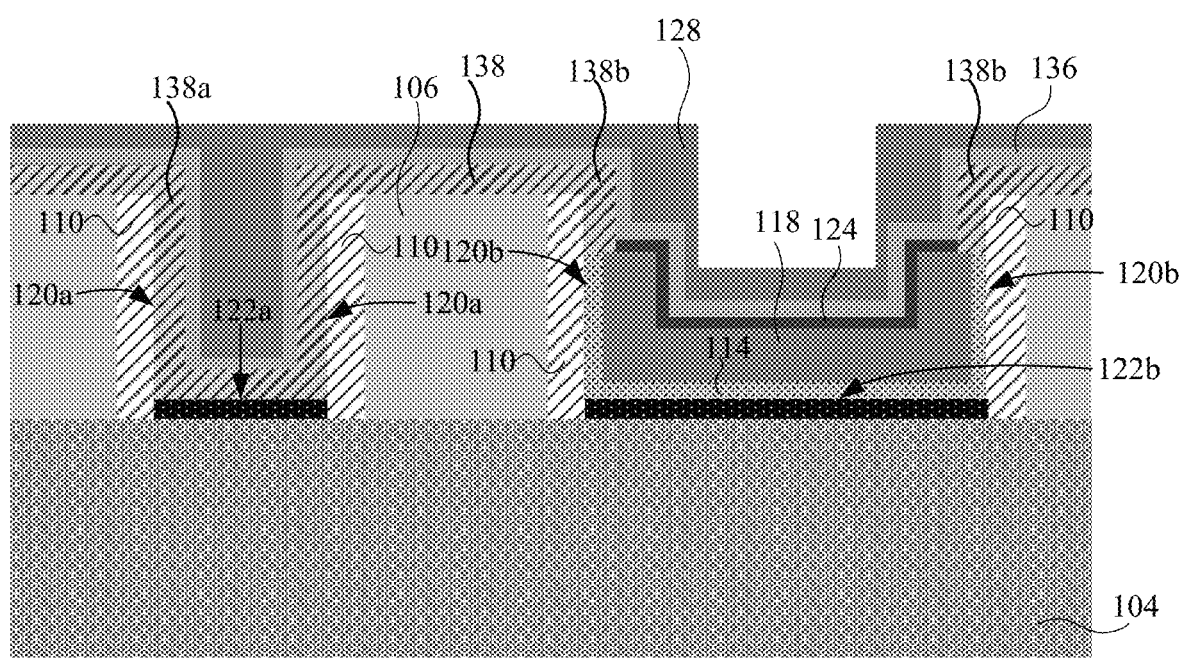

Referring to FIG. 10, the semiconductor device structure may be annealed to form an intermix layer 138a in the first opening 108a. The intermix layer may be formed using the first and second material layers 114 and 124. An intermix layer 138b is also formed in the second opening 108b on a portion of the sidewalls 120b above the protective layer 118. An intermix layer 138 is also formed on an upper surface of the dielectric structure 106. The annealing may be performed at a temperature range of 500 to 1000° C. in $N_2$ and or $N_2/O_2$ gases. The sacrificial liners 136 and 128 protect the intermix layer 138a and 138b from oxygen diffusion during the annealing step.

The term "intermixed", as used herein, refers to molecules of a first material layer 114 that are distributed between molecules of a second material layer 124, in which the first and second material layers differ from each other as described herein.

The intermix layer 138a has a lower effective oxide thickness (EOT) as compared to the resultant thickness of the individual material layers 114 and 124. The decrease in EOT results in better device performance through better channel control. In addition, the decrease in EOT also allows a thicker physical thickness of the intermix layer to be used as compared to the resultant thickness of the individual material layers 114 and 124. Hence, this results in better reliability of the device such as improved resistance to gate dielectric breakdown. In an aspect of the present disclosure, the intermix layers 138a and 138b are high-k intermix layers.

Figure 11:
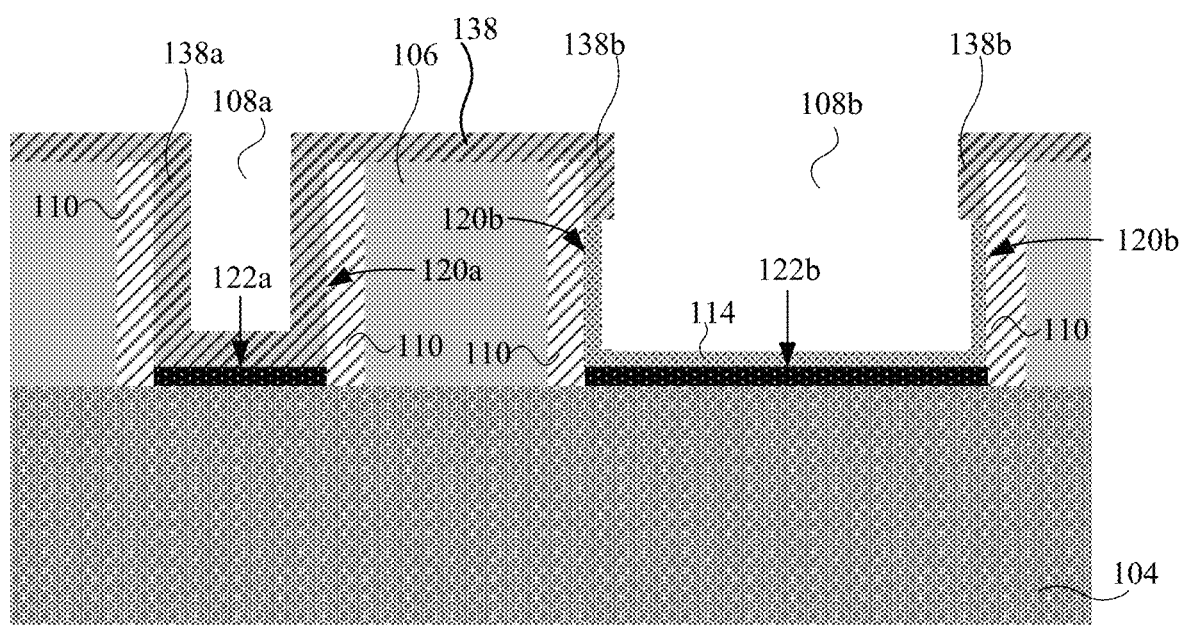

Referring to FIG. 11, sacrificial liners 136 and 128 and the protective layer 118 may be removed from the semiconductor device structure by a selective etching process. The intermix layer 138a is formed at the bottom surface 122a and on the sidewalls 120a in the first opening 108a. The bottom surface 122b and lower portion of the sidewalls 120b are covered by the first material layer 114 and upper portions of sidewalls 120b are covered by the intermix layer 138b in the second gate opening 108b. The intermix layer 138a and the first material layer 114 at the bottom surfaces 122a and 122b of the first and second openings 108a and 108b above the active region 104 have different EOTs, resulting in different threshold voltages.

Figure 12:
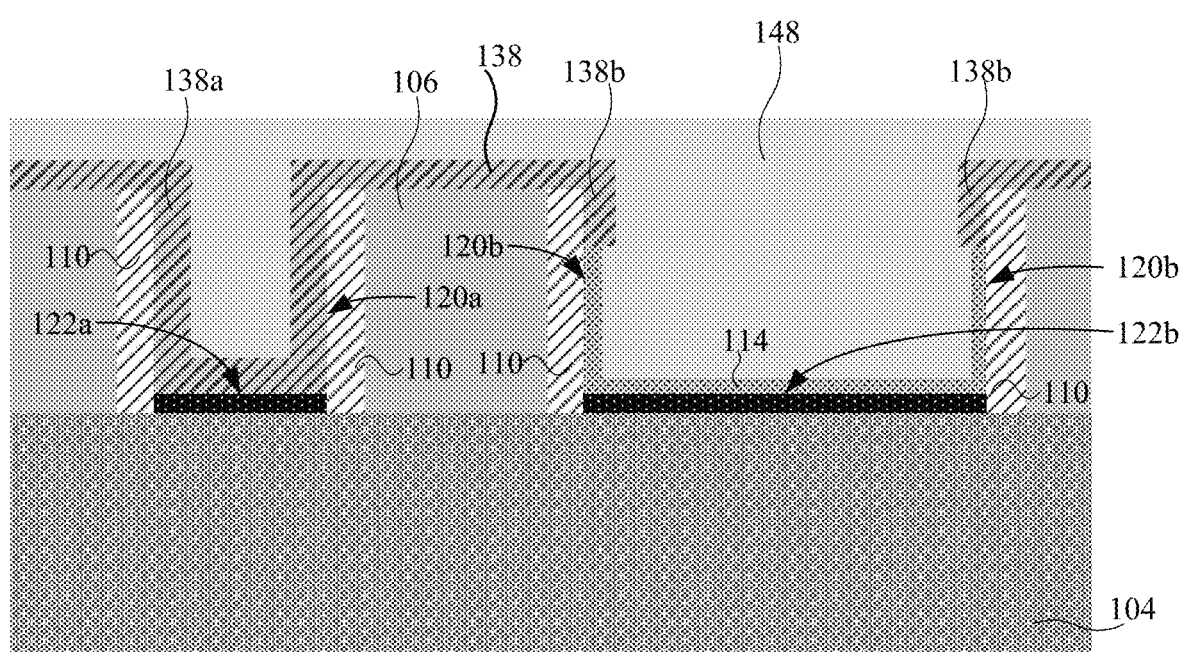

Referring to FIG. 12, a work function metal layer 148 may be deposited over the semiconductor device structure. The work function metal layer 148 may include any metallic compound or a composition of metallic compounds capable of modifying the work function property of a gate electrode. Examples of metallic compounds may include, but not limited to, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, Pt, Rh, Ir, Ru, Cu, Os, Be, Co, Pd, Te, Cr, Ni, a stack thereof, a conductive oxide thereof, a conductive nitride thereof, an alloy thereof, and a combination thereof. In particular, the work function metal layer 148 is preferably a TiN layer. The work function metal layer 148 may have a thickness in the range of about 0.5 nm to about 20 nm.

Figure 13:
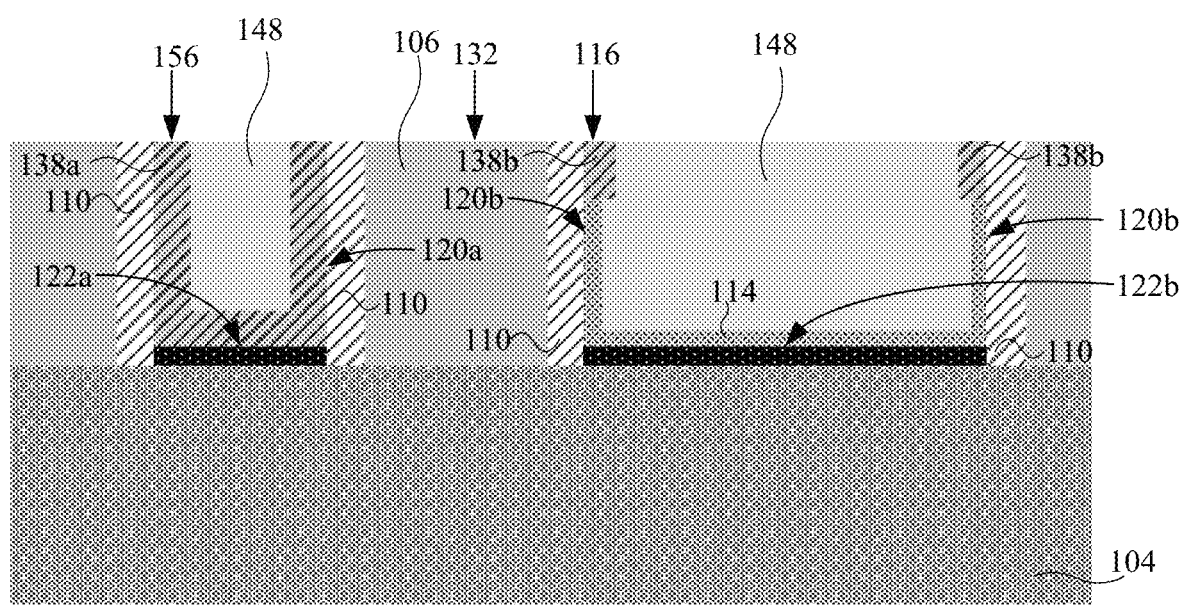

Referring to FIG. 13, the present semiconductor device structure is planarized; in particular, the work function metal layer 148 on the upper surface of the dielectric structure 106 may be removed by CMP. The intermix layer 138 on the upper surface of the dielectric structure 106 is also removed during the CMP process. A top surface 156 of the intermix layer 138a disposed over the sidewalls of the first opening 108a and a top surface 116 of the intermix layer 138b disposed over the sidewalls of the second opening 108b are co-planar with a top surface 132 of the dielectric structure 106.

Advantageously, the present method is found to enable the fabrication of multiple semiconductor device structures with long channel and short channel components having different gate dielectric layers without using additional lithography process steps and the associated lithography mask (e.g., a reticle mask), thereby significantly reducing the fabrication cost and complexity of the semiconductor device. More advantageously, the present method is found to enable the formation of long channel and short channel semiconductor device structures having different threshold voltage properties.

Throughout this disclosure, the terms top, upper, upwards, over, and above refer to the direction away from the active region. Likewise, the terms bottom, lower, downwards, under, and below refer to the direction towards the active region. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many conventional processes are only mentioned briefly herein or omitted entirely without providing the well-known process details.

As will be readily apparent to those skilled in the art upon a complete reading of the present application, the methods of forming the semiconductor structure disclosed herein may be employed in manufacturing a variety of different integrated circuit products, including, but not limited to, logic products, memory products, 3D transistor devices, FinFET transistor devices, planar transistor devices, CMOS devices, SOI devices etc.

What is claimed is:

1. A semiconductor device comprising:
    a first and second structures formed above an active region, wherein the first and second structures are separated by a dielectric structure;
    the first and second structures having sidewalls and bottom surfaces, wherein the bottom surface of the first structure is narrower than the bottom surface of the second structure;
    a high-k intermix layer disposed over the sidewalls and over the bottom surface of the first structure and over an upper portion of the sidewalls of the second structure; and
    a high-k layer disposed over a lower portion of the sidewalls and over the bottom surface of the second structure.

2. The semiconductor device of claim 1, wherein the high-k layer and the high-k intermix layer are of different thicknesses.

3. The semiconductor device of claim 1, wherein the high-k intermix layer disposed over the sidewalls and over the bottom surface of the first structure has a dielectric constant greater than 10.

4. The semiconductor device of claim 1, wherein the high-k layer disposed over the lower portion of the sidewalls and over the bottom surface of the second structure has a dielectric constant greater than 10.

5. The semiconductor device of claim 1, wherein the high-k intermix layer comprises a first high-k material and a second high-k material, wherein the high-k layer includes the first high-k material.

6. The semiconductor device of claim 1 further comprising a work function metal over the first and second structures.

7. The semiconductor device of claim 1 further comprising an oxide layer disposed on the bottom surface of the first structure between the high-k intermix layer and the active region.

8. The semiconductor device of claim 1, further comprising an oxide layer disposed on the bottom surface of the second structure between the high-k layer and the active region.

9. The semiconductor device of claim 5, wherein the first high-k material and the second high-k material are different high-k dielectric materials.

10. A semiconductor device comprising:
- a first and second structures formed above an active region, wherein the first and second structures are separated by a dielectric structure;
- the first and second structures having sidewalls and bottom surfaces, wherein the bottom surface of the first structure is narrower than the bottom surface of the second structure;
- a high-k intermix gate dielectric layer disposed over the sidewalls and over the bottom surface of the first structure and over an upper portion of the sidewalls of the second structure; and
- a high-k gate dielectric layer disposed over a lower portion of the sidewalls and the bottom surface of the second structure.

11. The semiconductor device of claim 10 wherein the high-k gate dielectric layer and the high-k intermix gate dielectric layer are of different thicknesses.

* * * * *